United States Patent
Lee

(10) Patent No.: US 10,469,045 B2
(45) Date of Patent: Nov. 5, 2019

(54) MULTI-INPUT AMPLIFIER WITH IMPROVED RETURN LOSS AND MISMATCH OVER GAIN MODES

(71) Applicant: SKYWORKS SOLUTIONS, INC., Woburn, MA (US)

(72) Inventor: Junhyung Lee, Irvine, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/692,912

(22) Filed: Aug. 31, 2017

(65) Prior Publication Data

US 2018/0062598 A1     Mar. 1, 2018

Related U.S. Application Data

(60) Provisional application No. 62/382,676, filed on Sep. 1, 2016.

(51) Int. Cl.

| | |
|---|---|
| H03G 3/20 | (2006.01) |
| H03G 3/30 | (2006.01) |
| H03F 3/45 | (2006.01) |
| H03F 3/21 | (2006.01) |
| H03F 1/22 | (2006.01) |

(Continued)

(52) U.S. Cl.
CPC .......... *H03G 3/3036* (2013.01); *H03F 1/223* (2013.01); *H03F 1/56* (2013.01); *H03F 3/21* (2013.01); *H03F 3/245* (2013.01); *H03F 3/45179* (2013.01); *H03F 3/72* (2013.01); *H03G 1/0029* (2013.01); *H03G 1/0088* (2013.01); *H03G 3/001* (2013.01); *H03G 3/3063* (2013.01); *H03F 2200/111* (2013.01); *H03F 2200/211* (2013.01); *H03F 2200/222* (2013.01); *H03F 2200/294* (2013.01); *H03F 2200/451* (2013.01); *H03F 2203/7209* (2013.01)

(58) Field of Classification Search
CPC . H03F 1/22; H03F 1/223; H03F 1/226; H03F 2200/21; H03G 3/20; H03G 3/3026
USPC .......................................... 330/284, 311, 144
See application file for complete search history.

(56) References Cited

U.S. PATENT DOCUMENTS

| | | | | |
|---|---|---|---|---|
| 5,245,229 | A * | 9/1993 | Colvin, Sr. ............ | H03G 7/005 327/309 |
| 6,545,534 | B1 * | 4/2003 | Mehr ........................ | H03F 3/68 330/254 |

(Continued)

*Primary Examiner* — Steven J Mottola
(74) *Attorney, Agent, or Firm* — Chang & Hale LLP

(57) ABSTRACT

A signal amplifier having an input impedance that varies over different bias currents, the signal amplifier comprising a compensation stage including a switchable variable resistance configured to provide a targeted adjustment to the input impedance. A signal amplifier comprising: a variable-gain stage configured to provide a plurality of gain levels that result in different input impedance values; and a compensation stage having a switchable variable resistance configured to provide a targeted adjustment to a respective input impedance. a compensation stage having an output coupled to an input of the gain stage, the compensation stage including a plurality of band selection switches coupled to the plurality of input nodes and a plurality of switchable variable resistance branches coupled to the band selection switches, individual switchable variable resistance branches configured to provide a targeted adjustment to a respective input impedance.

19 Claims, 7 Drawing Sheets

(51) Int. Cl.
  *H03F 1/56* (2006.01)
  *H03G 1/00* (2006.01)
  *H03G 3/00* (2006.01)
  *H03F 3/24* (2006.01)
  *H03F 3/72* (2006.01)

(56) References Cited

U.S. PATENT DOCUMENTS

| | | | | |
|---|---|---|---|---|
| 8,626,106 B2 * | 1/2014 | Soe | .................. | H03D 7/125 |
| | | | | 455/341 |
| 2005/0140454 A1 * | 6/2005 | Uesaka | .................. | H03F 3/08 |
| | | | | 330/308 |
| 2013/0314164 A1 * | 11/2013 | Din | .................. | H03F 1/0205 |
| | | | | 330/296 |

* cited by examiner

MULTI-INPUT AMPLIFIER WITH IMPROVED RETURN LOSS AND MISMATCH OVER GAIN MODES

CROSS-REFERENCE TO RELATED APPLICATIONS

This application claims priority to U.S. Provisional Application No. 62/382,676 filed Sep. 1, 2016 and entitled "MULTI-INPUT AMPLIFIER WITH IMPROVED RETURN LOSS AND MISMATCH OVER GAIN MODES," which is expressly incorporated by reference herein in its entirety for all purposes.

BACKGROUND

Field

The present disclosure generally relates to amplifiers for wireless communication devices.

Description of Related Art

In electronic applications, such as radio-frequency (RF) applications, it is sometimes desirable to amplify a signal. For example, a to-be-transmitted signal can be amplified by a power amplifier, and a received signal can be amplified by a low-noise amplifier. In some applications, it is beneficial to reduce impedance mismatches in the amplification chain to improve signal quality.

SUMMARY

According to a number of implementations, the present disclosure relates to a signal amplifier having an input impedance that varies over different bias currents, the signal amplifier comprising a compensation stage including a switchable variable resistance configured to provide a targeted adjustment to the input impedance.

In some embodiments, the switchable variable resistance includes a switching transistor and variable resistor. In some embodiments, the signal amplifier includes a plurality of input ports. In further embodiments, the compensation stage includes a plurality of branches corresponding to the plurality of input ports, each branch including a switchable variable resistance configured to provide a targeted adjustment to the input impedance.

In some embodiments, the targeted adjustment to the input impedance results in a total input impedance of the signal amplifier that is about 50Ω. In some embodiments, in a first gain mode the switchable variable resistance provides a first resistance value and in a second gain mode lower than the first gain mode the switchable variable resistance provides a second resistance value greater than the first resistance value.

According to a number of implementations, the present disclosure relates to a signal amplifier that includes a variable-gain stage configured to provide a plurality of gain levels that result in different input impedance values; and a compensation stage having a switchable variable resistance configured to provide a targeted adjustment to a respective input impedance.

In some embodiments, the switchable variable resistance is configured to increase the resistance provided with decreases in gain levels. In some embodiments, the switchable variable resistance is coupled to a source of an RF stage transistor of the variable-gain stage. In some embodiments, the amplifier further includes a band selection switch coupled to the compensation stage, the band selection switch configured to selectively couple an input node of the signal amplifier to a reference potential node.

According to a number of implementations, the present disclosure relates to a radio-frequency (RF) amplifier that includes a plurality of input nodes and an output node. The amplifier also includes a gain stage configured to provide a plurality of gain levels that result in different input impedance values. The amplifier also includes a compensation stage having an output coupled to an input of the gain stage, the compensation stage including a plurality of band selection switches coupled to the plurality of input nodes and a plurality of switchable variable resistance branches coupled to the band selection switches, individual switchable variable resistance branches configured to provide a targeted adjustment to a respective input impedance.

In some embodiments, the RF amplifier is a low-noise amplifier (LNA). In further embodiments, the LNA is implemented in a cascode configuration having an input stage and a cascode stage.

In some embodiments, the targeted adjustment to the respective input impedance at each of a plurality of gain settings is selected to provide an approximately constant impedance at each of the plurality of input nodes. In some embodiments, each of the plurality of band selection switches is configured to selectively couple a corresponding input node to a reference potential node.

In some embodiments, each of the switchable variable resistance branches is configured to selectively provide a bypass path in at least one gain mode and a resistance path in at least one other gain mode. In further embodiments, the resistance path includes at least one variable resistive element that provides a targeted resistance value as a function of the plurality of gain levels.

According to a number of implementations, the present disclosure relates to a method for amplifying a signal that includes receiving signals at a plurality of input nodes. The method also includes configuring a gain stage to be in a selected one of a plurality of gain settings, at least some of the gain settings resulting in different impedances presented to the signal. The method also includes adjusting the resistance presented to the signal by the gain stage for the selected gain setting, the adjusted resistance being configured to provide a targeted constant value of the impedance at the input across the plurality of gain settings. The method also includes amplifying at least a portion of the received signals. The method also includes transmitting the amplified signals to an output port.

In some embodiments, the gain stage is part of a low-noise amplifier (LNA). In some embodiments, the adjusted resistance results in an approximately constant impedance among the plurality of gain settings. In some embodiments, the method also includes selecting signals received at a subset of the plurality of input ports using a band selection switch.

In some embodiments, the adjusting of the resistance includes adjusting one or more of variable resistor coupled to a source of an RF stage transistor of the gain stage. In further embodiments, the adjusting of the resistance includes operating a plurality of transistors that selectively provide a bypass path and a resistance path, the resistance path passing through the one or more variable resistor.

According to a number of implementations, the present disclosure relates to a semiconductor die having a signal circuit, the semiconductor die including a substrate and a signal amplifier implemented on the substrate, the signal amplifier having an input impedance that varies over different bias currents, the signal amplifier comprising a compensation stage including a switchable variable resistance configured to provide a targeted adjustment to the input impedance.

In some embodiments, the substrate includes a silicon-on-insulator (SOI) substrate. In some embodiments, the signal amplifier is a low-noise amplifier (LNA).

According to a number of implementations, the present disclosure relates to a communications module that includes a packaging substrate configured to receive a plurality of components; and a signal amplifier implemented on the packaging substrate, the signal amplifier having an input impedance that varies over different bias currents, the signal amplifier comprising a compensation stage including a switchable variable resistance configured to provide a targeted adjustment to the input impedance.

In some embodiments, the signal amplifier is implemented on a semiconductor die that is mounted on the packaging substrate. In some embodiments, the signal amplifier is a low-noise amplifier (LNA). In some embodiments, the module is a diversity receive (DRx) module.

According to a number of implementations, the present disclosure relates to a wireless device that includes an antenna configured to at least receive a communications signal. The wireless device also includes a signal amplifier in communication with the antenna, the signal amplifier having an input impedance that varies over different bias currents, the signal amplifier comprising a compensation stage including a switchable variable resistance configured to provide a targeted adjustment to the input impedance. The wireless device also includes a transceiver configured to process an amplified signal from the signal amplifier.

In some embodiments, the wireless device is a cellular phone configured to include different gains in receive operations.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Overview

Figure 1:
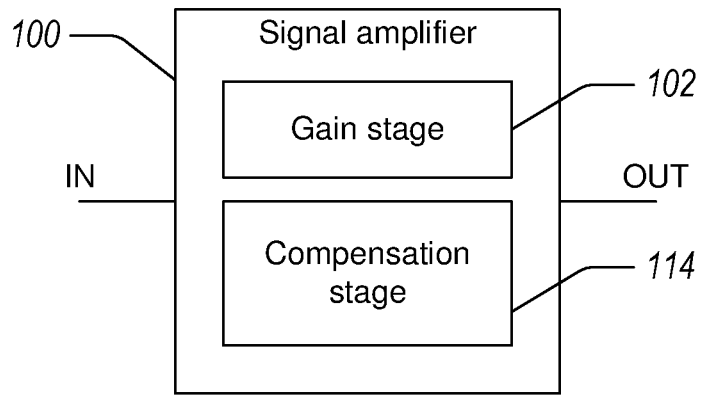
FIG. 1 depicts a signal amplifier having a gain stage and a compensation stage.

Described herein are architectures, circuits, devices and methods related to, among others, radio-frequency (RF) amplifiers having impedance adjustment functionality for various gain modes. FIG. 1 depicts a signal amplifier 100 having a gain stage 102 and a compensation stage 104. Such a signal amplifier 100 can receive an input signal (IN) and amplify such a signal to generate an output signal (OUT). In certain implementations, the gain stage 102 includes one or more amplifying transistors. For the purpose of description, various examples related to such signal amplifier 100 are described in the context of a low-noise amplifier (LNA). However, it will be understood that one or more features of the present disclosure can also be implemented for other types of signal amplifiers, including power amplifiers (PAs).

In many LNA applications, it is desirable to match impedances to increase or maximize power transfer between signal processing stages. Such a performance feature can maintain desirable signal characteristics in, for example, receive demodulation over different LNA gain modes, especially in higher order modulation systems. In some embodiments, an LNA circuit having one or more features as described herein can be configured to adjust impedances to match an input impedance at an input of the LNA circuit over different gain modes. It may also be desirable to have a real value of an input impedance to be close to a target value (e.g., 50Ω) to eliminate or minimize significant reflection or mismatch that can lead to performance degradation The compensation stage 104 can provide a switchable variable resistance configured to provide a targeted adjustment to the input impedance. By providing a selected resistance, a desired adjustment to the input impedance can be provided. Advantageously, the compensation stage 104 can be configured to reduce or eliminate power loss by fixing LNA input impedance to transfer maximum power over gain modes. The compensation stage 104 can be configured to improve receive NF performance by reducing or minimizing impedance mismatches from the previous signal processing stage. The compensation stage 104 can be configured to maintain pre-LNA filter performance by reducing or eliminating impedance mismatch with the LNA circuit.

Figure 2:
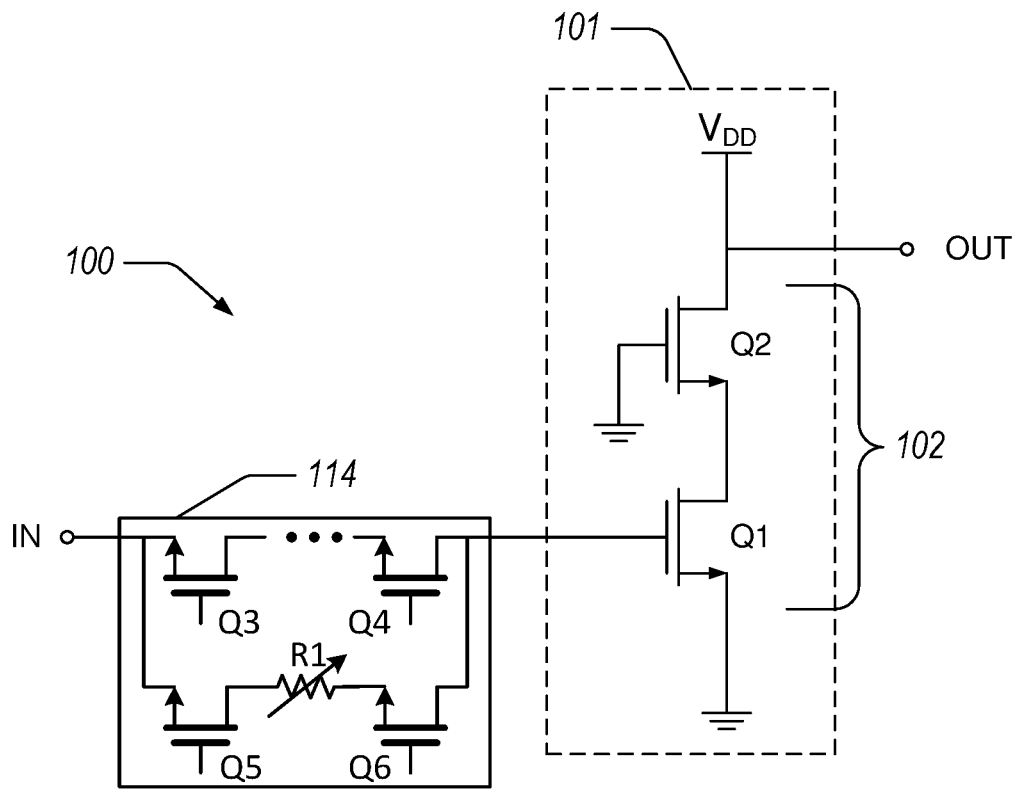
FIG. 2 illustrates an example implementation of a signal amplifier that includes an amplifier block and a compensation stage, the amplifier having one or more features as described herein.

FIG. 2 illustrates an example implementation of a signal amplifier 100 that includes an amplifier block 101 and a compensation stage 114, the amplifier having one or more features as described herein. The amplifier block 101 includes first and second transistors (collectively indicated as a gain stage 102) implemented in a cascode configuration. For example, the first transistor Q1 can be configured to operate as a common source device (also referred to as an RF stage), and the second transistor Q2 can be configured to operate as a common gate device (also referred to as a cascode stage). The amplifier block 101 is coupled to a compensation stage 114 at an input of the amplifier block 101. The compensation stage is configured to provide a bypass path through transistors Q3 and Q4 or a resistive path through variable resistor R1. More particularly, an input signal (IN) is shown to be provided to the compensation stage 114, passed to a gate of the first transistor Q1, and the amplified signal is output through its drain. The source of the first transistor Q1 is shown to be coupled to ground. The amplified signal from the drain of the first transistor Q1 is shown to be provided to a source of the second transistor Q2 for further amplification, and such further amplified signal is shown to be output through the drain of the second transistor Q2. The gate of the second transistor Q2 is shown to be coupled to ground. The first and second transistors Q1, Q2 can be biased appropriately. In the example of FIG. 2, the second transistor Q2 is shown to be provided with a supply voltage $V_{DD}$ at its drain.

The compensation stage 114 can be configured to provide a selected or targeted resistance prior to the amplifier block 101. The compensation stage 114 can be configured to provide a programmed or tailored resistance to an input signal, the programmed or tailored resistance configured to compensate for changes in impedance at the amplifier block 101. These changes in impedance can arise due at least in part to changes in gain mode provided by the signal amplifier 100. Various examples of such a compensation stage 114 are described herein in greater detail.

Figure 3:
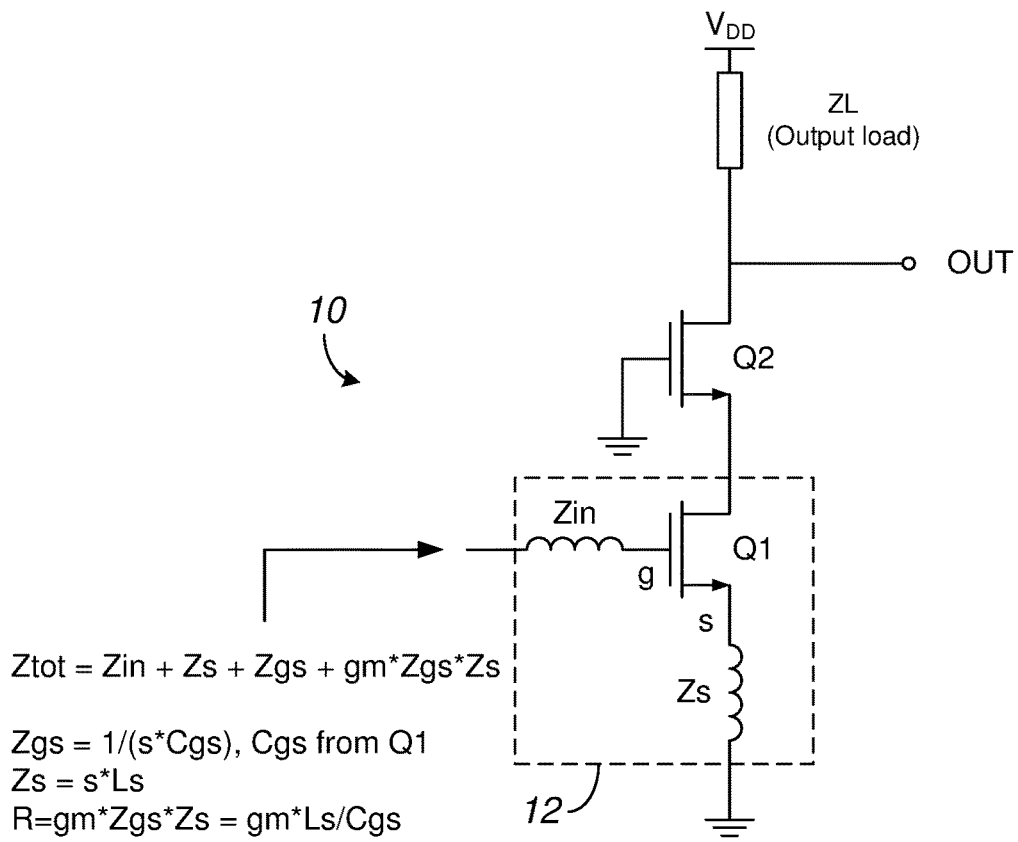
FIG. 3 shows a typical (low-noise amplifier) LNA configured as a cascode amplifier, but without an impedance compensation stage.

FIG. 3 shows a typical LNA 10 configured as a cascode amplifier, but without an impedance compensation stage. The RF stage 12 is depicted with impedances associated with various portions of the transistor Q1. For example, an input path to the gate of Q1 can have an effective inductance that results in an input impedance Zin presented to an input signal. Similarly, the grounding path of the source of Q1 can have an effective inductance that results in a source impedance Zs. One or more other impedances can arise from Q1, including, for example, a gate-to-source impedance Zgs and a transconductance related impedance gm*Zgs*Zs. Thus, with such example impedances, a total impedance Ztot presented to the input RF signal can be expressed as Ztot=Zin+Zs+Zgs+gm*Zgs*Zs.

Figure 4:
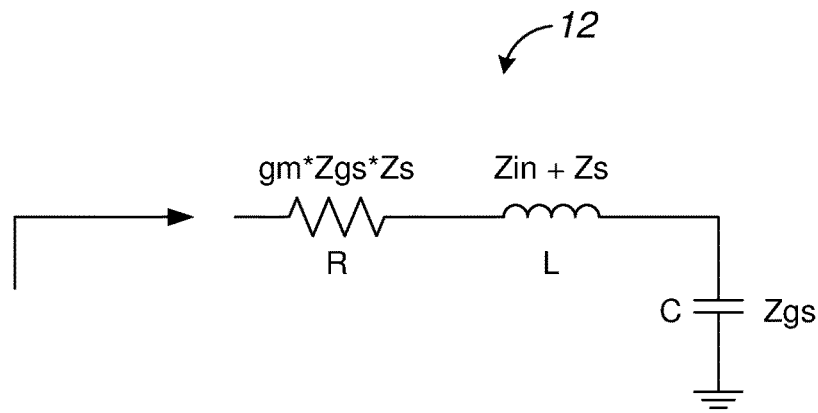
FIG. 4 shows an example of how the radio-frequency (RF) stage of FIG. 3 can be represented as an RLC circuit.

FIG. 4 shows an example of how the RF stage 12 of FIG. 3 can be represented as an RLC circuit 12. Such a circuit can include a resistance R having one end at the input and the other end connected to one end of an inductance L. The other end of the inductance L can be coupled to ground through a capacitance C. The resistance R can be associated with the transconductance term gm*Zgs*Zs, the inductance L can be associated with a sum of Zin and Zs, and the capacitance C can be associated with Zgs. In such a representation, the resonance frequency can be expressed as:

$$\omega_o = \frac{1}{\sqrt{LC}}. \quad (1)$$

For the purpose of description, when operated at or near the resonance frequency, the principle contribution to the impedance at the input of the gain stage is the "R" contribution, or gm*Zgs*Zs, which is also equal to gm*Ls*Cgs (where Ls arises from the inductance of the source impedance and Cgs arises from the capacitance of the transconductance term).

Figure 5:
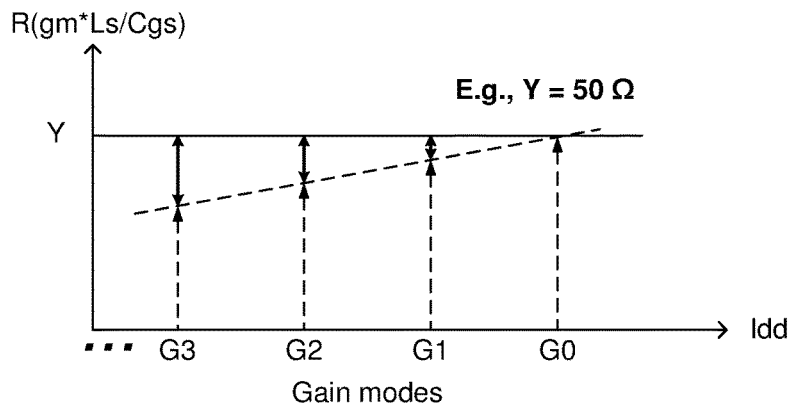
FIG. 5 illustrates that the resistance [R(gm*Ls/Cgs)] of FIGS. 3 and 4 can vary as a function of supply current.

In the example of FIGS. 3 and 4, the LNA 10 can be operated at different gain modes by adjusting the supply current, Idd. With such change in supply current, an electrical parameter such as Cgs can also change. For example, FIG. 5 shows that R(gm*Ls/Cgs) of FIGS. 3 and 4 can vary as a function of supply current. Thus, at a first supply current setting for an example gain mode G3, R can have a first value. Similarly, a second Idd setting for a gain mode G2 can result in R having a second value that is greater than the first R value. Continuing such a trend, third and fourth settings for gain modes G1 and G0 can result in R having third and fourth values having successively greater values. Thus, in FIG. 5, the solid line depicts an example relationship between R and supply current, Idd.

In the example of FIGS. 3 and 4, the foregoing variation in R can result in a corresponding variation in impedance as a function of supply current, Idd. Such a variation in impedance may be undesirable as it may degrade performance of a signal amplifier through, for example, unwanted return loss and impedance mismatch. Accordingly, it may be advantageous to adjust the R value to achieve a substantially constant value of R across multiple gain modes and supply currents. This targeted value of R is shown as a dashed-dotted line in FIG. 5 at the value Y. The target value, Y, can typically be 50Ω in wireless communication applications.

Figure 6:
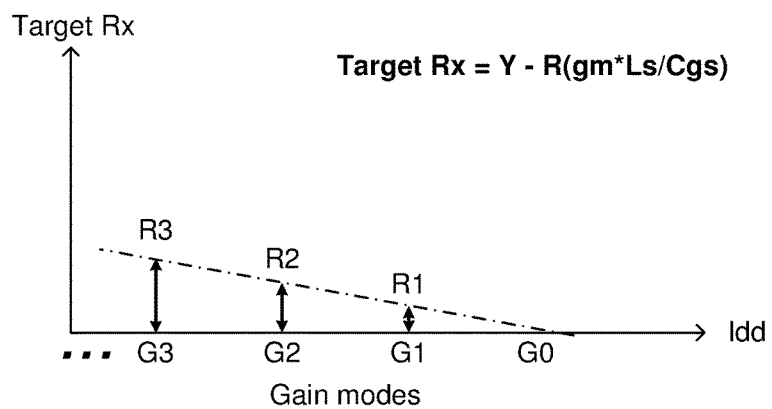
FIG. 6 illustrates a targeted resistance value, Rx, to compensate for the variation in resistance at the input of the amplifier as a function of supply current, Idd, and gain mode.

FIG. 6 illustrates a targeted resistance value, Rx, to compensate for the variation in resistance at the input of the amplifier as a function of supply current, Idd, and gain mode. In certain implementations, this targeted resistance value, Rx, can be set equal to the difference between the target impedance, Y, and the resistance as a function of supply current, or R(gm*Ls/Cgs). It is to be understood that although the target resistance, Rx, is shown as being 0 or close to 0 at a high gain mode (e.g., G0), there may be an offset such that the target resistance, Rx, does not pass reach 0 for any potential supply current. This can cause the target Rx plot to be offset vertically from the axis.

Figure 7:
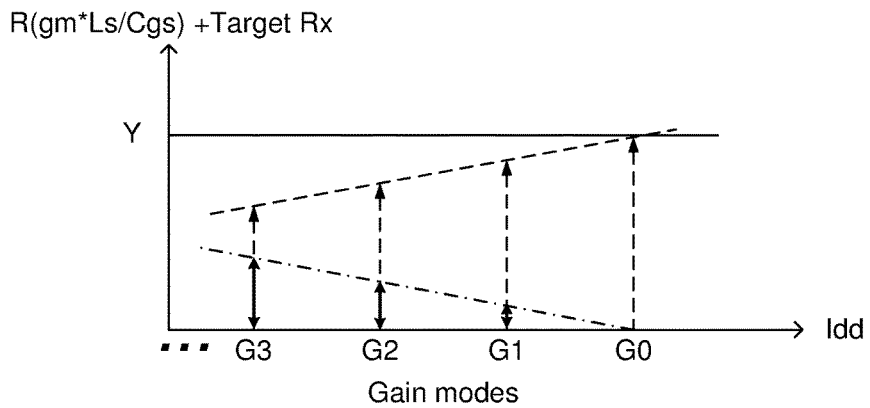
FIG. 7 illustrates the result of providing a target resistance, Rx, prior to the gain block that has a real impedance, R, that changes with supply current, Idd, and hence gain mode.

FIG. 7 illustrates the result of providing a target resistance, Rx, prior to the gain block that has a real impedance, R, that changes with supply current, Idd, and hence gain mode. By providing tailored resistances as a function of supply current, the total resistance provided to a signal passing through the amplification chain can be a target impedance, Y. Advantageously, this can improve power transfer to the gain block from prior processing stages, reduce or minimize return loss over gain modes, and/or maintain pre-amplification filter performance by reducing impedance mismatch with the amplifier at the amplifier input.

Because real impedance as a function of gain mode changes (e.g., it increases with higher gain) there arises an undesirable gap between the real R value at the input and the target R value (e.g., the value that reduces or minimizes signal degradation). Accordingly, described herein are compensation circuits that include switchable variable resistance configured to provide a tailored resistance to present an input signal with a total targeted real impedance value. Such compensation circuits can be implemented in signal amplifiers with variable gain stages that provide a plurality of gain levels. These compensation circuits can also be extended to multi-input amplifiers to provide tailored resistance values at each input.

Figure 8:
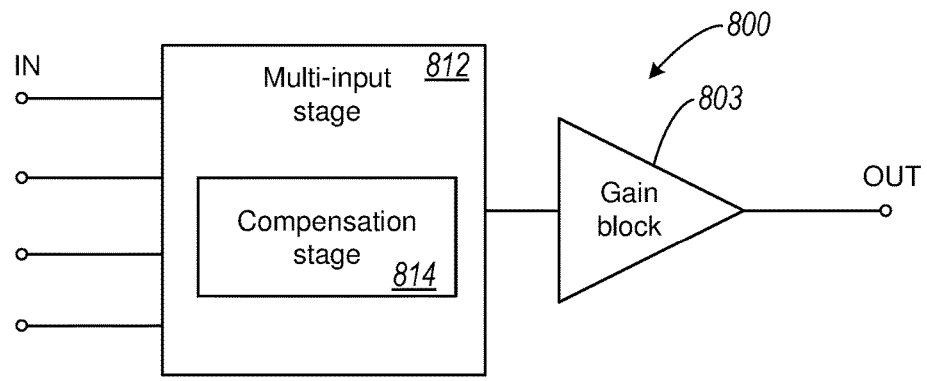
FIG. 8 illustrates a signal amplifier having a multi-input stage with a compensation stage prior to a gain block.

As illustrated in FIG. 8, this can be achieved in a signal amplifier 800 having a multi-input stage 812 with a compensation stage 814 prior to a gain block 803. The compensation stage 814 can include a switchable variable resistance that is configured to create a fixed real impedance across different gain modes of the gain block 803. The multi-input stage 812 can be configured to receive multiple inputs and provide a single output. In the multi-input stage 812, the compensation stage 814 can be configured to provide programmed resistances tailored for signals received at individual inputs or a single programmed resistance tailored for signals received at a plurality of inputs.

Figure 9:
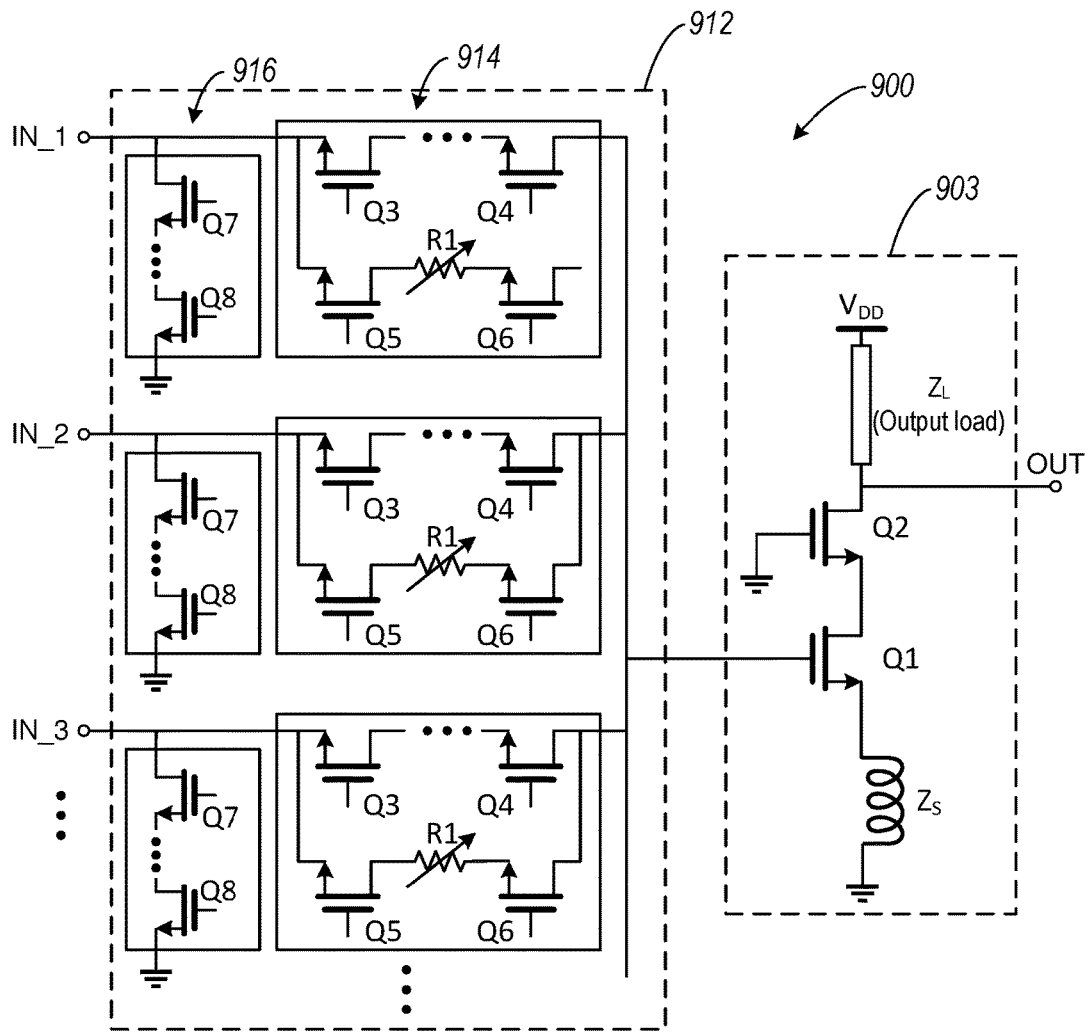
FIG. 9 illustrates an example of a compensation stage that can be implemented for a signal amplifier.

FIG. 9 illustrates an example of a compensation stage 914 that can be implemented for a signal amplifier 900 (e.g., an LNA). The compensation stage 914 includes a plurality of input selection circuits 916, individual input selection circuits coupled to respective inputs. The input selection circuits 916 include switching elements, such as transistors Q7, Q8 configured to selectively provide a path to a reference potential node. When an individual input selection circuit 916 is activated, signals received at a respective input are directed to the reference potential node and do not pass through the compensation stage 914 or gain block 903. The switches in the compensation stage 914 can also be configured to be deactivated when an input node is not selected. In this way, the signal amplifier can provide multiplexing functionality by selectively directing signals received at a plurality of inputs to a single output.

The compensation stage 914 includes a plurality of switchable variable resistance branches, each branch having a bypass path in parallel with a resistance path through variable resistor R1. The bypass path can be activated by activating transistors Q3, Q4 and deactivating transistors Q5, Q6. The resistance path can be activated by deactivating transistors Q3, Q4 and activating transistors Q5, Q6. These paths can be individually selected for individual input nodes. The variable resistor R1 can be configured to provide tailored resistance values that compensate for changes in real impedance values at the input of the gain block 903. In this way, the compensation stage 914 can provide programmed resistances for a plurality of inputs, individual programmed resistances configured to compensate for changes in impedance caused by changes in gain mode. In certain implementations, it is desirable to provide a bypass path through the compensation stage 914, such as when the real impedance value at the gain block is at or near a targeted value.

Accordingly, FIGS. 8 and 9 illustrate signal amplifiers 800, 900 having an input impedance that varies over different bias currents. The signal amplifiers 800, 900 include a compensation stage 814, 914 having a switchable variable resistance configured to provide a targeted or desired adjustment to the input impedance. Similarly, FIGS. 8 and 9 illustrate signal amplifiers 800, 900 having a variable-gain stage configured to provide a plurality of gain levels that result in different input impedance values. These signal amplifiers 800, 900 include a compensation stage 814, 914 having a switchable variable resistance configured to provide a targeted or desired adjustment to a respective input impedance.

Figure 10:
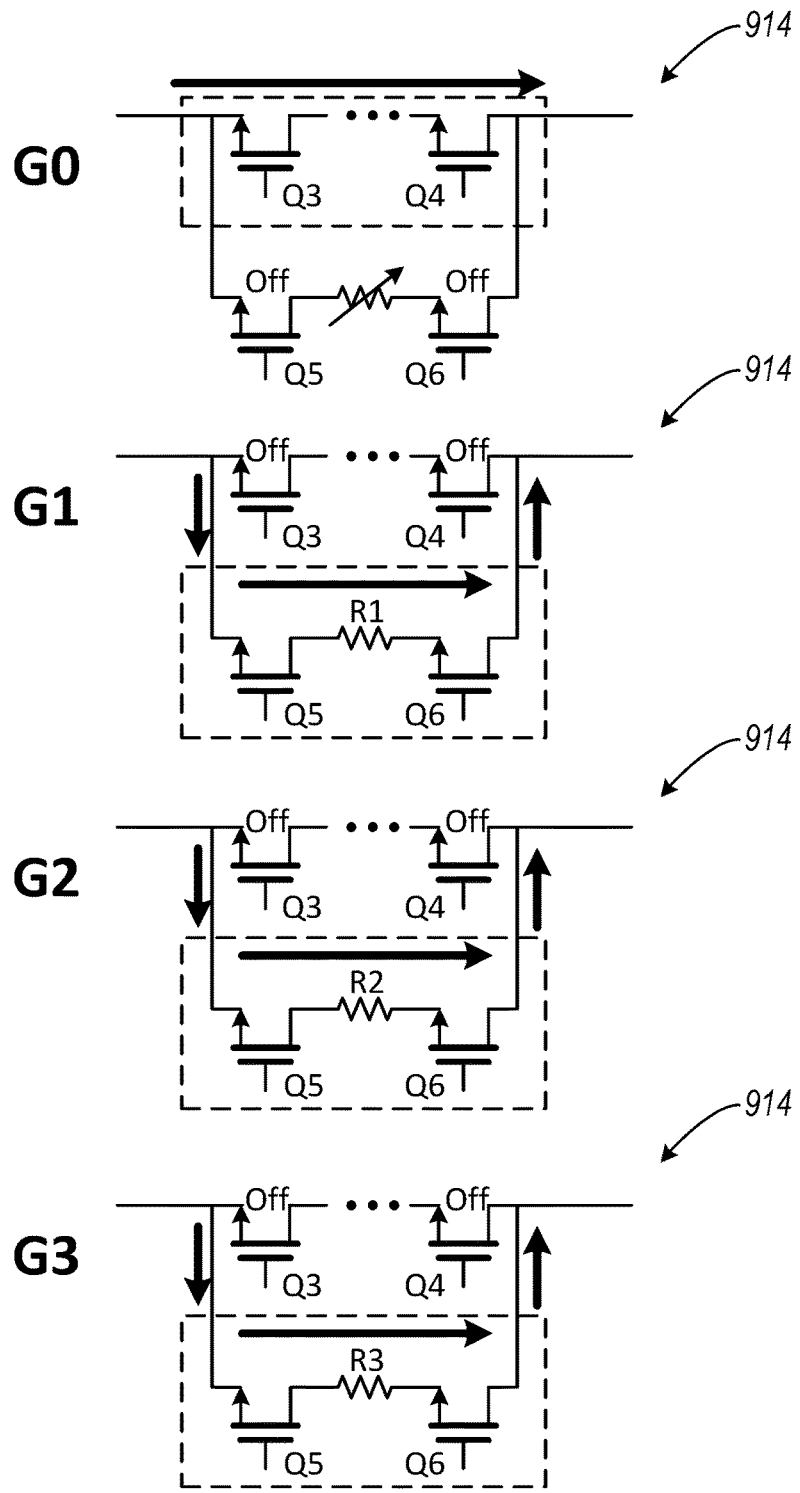
FIG. 10 illustrates different operating modes of the compensation stage of FIG. 9.

FIG. 10 illustrates different operating modes of the compensation stage 914 of FIG. 9. In a first gain mode G0, or a high gain mode, a branch of the compensation stage 914 can activate transistors Q3, Q4 and deactivate transistors Q5, Q6 to provide a bypass path through the compensation stage 914 branch. This bypasses the resistance provided in the resistance path of the compensation stage 914 branch. This can be advantageous where the input impedance of a gain stage is at or near a targeted value when operating in a high gain mode (e.g., gain mode G0).

Similarly, for a second gain mode G1, a branch of the compensation stage 914 can activate transistors Q5 and Q6 and deactivate transistors Q3, Q4 to provide a resistance path through a variable resistor in the compensation stage 914 branch. The programmed or tailored resistance can have a value R1 that, when added to the resistance of the input of the gain block that follows, results in a targeted value, Y, of the input impedance.

For a third gain mode G2, a branch of the compensation stage 914 can activate transistors Q5 and Q6 and deactivate transistors Q3, Q4 to provide a resistance path through a variable resistor in the compensation stage 914 branch. The programmed or tailored resistance can have a value R2 that, when added to the resistance of the input of the gain block that follows, results in a targeted value, Y, of the input impedance.

For a fourth gain mode G3, a branch of the compensation stage 914 can activate transistors Q5 and Q6 and deactivate transistors Q3, Q4 to provide a resistance path through a variable resistor in the compensation stage 914 branch. The programmed or tailored resistance can have a value R3 that, when added to the resistance of the input of the gain block that follows, results in a targeted value, Y, of the input impedance.

This can proceed for any gain modes provided by the signal amplifier. In addition, rather than being discrete values for the programmed resistance, the resistance can be provided as a continuous value that depends at least in part on the supply voltage of the gain block and/or a gain level of the gain block.

Products, Modules, Devices, and Architectures

Figure 11:
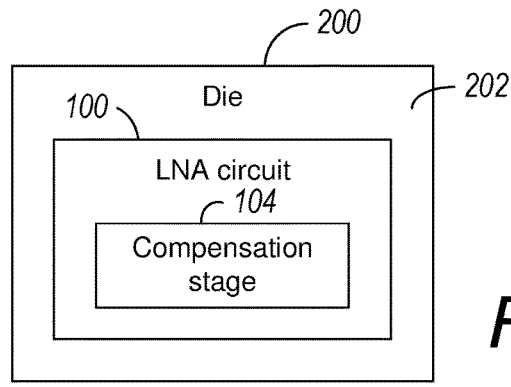
FIG. 11 shows that, in some embodiments, some or all of the features described herein can be implemented on a semiconductor die.

FIG. 11 shows that in some embodiments, some or all of an LNA 100 having one or more features as described herein can be implemented on a semiconductor die 200. Such a die can include a substrate 202, and at least some of a compensation stage 114 can be implemented on the substrate 202.

Figure 12:
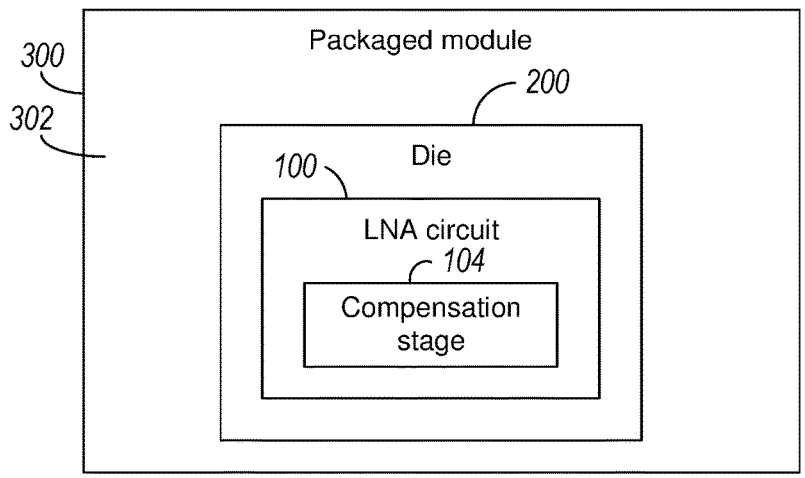
FIGS. 12 and 13 show that, in some embodiments, some or all of the features described herein can be implemented on a packaged module.
Figure 13:
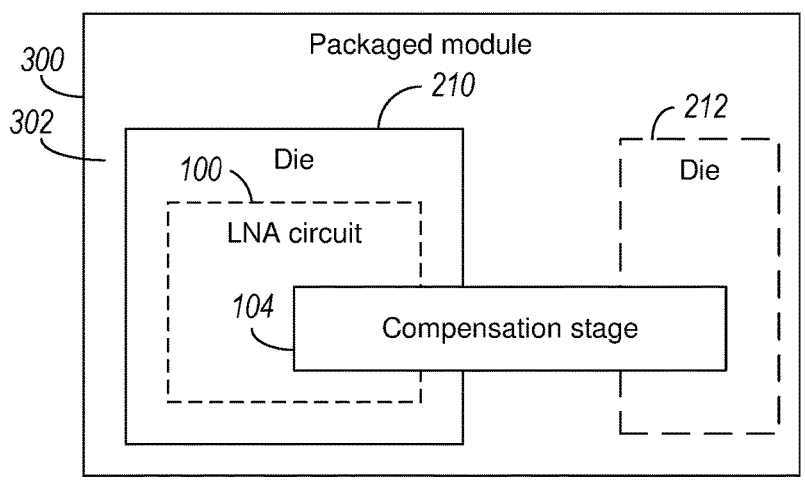

FIGS. 12 and 13 show that in some embodiments, some or all of an LNA 100 having one or more features as described herein can be implemented on a packaged module 300. Such a module can include a packaging substrate 302 configured to receive a plurality of components such as one or more die and one or more passive components.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 14:
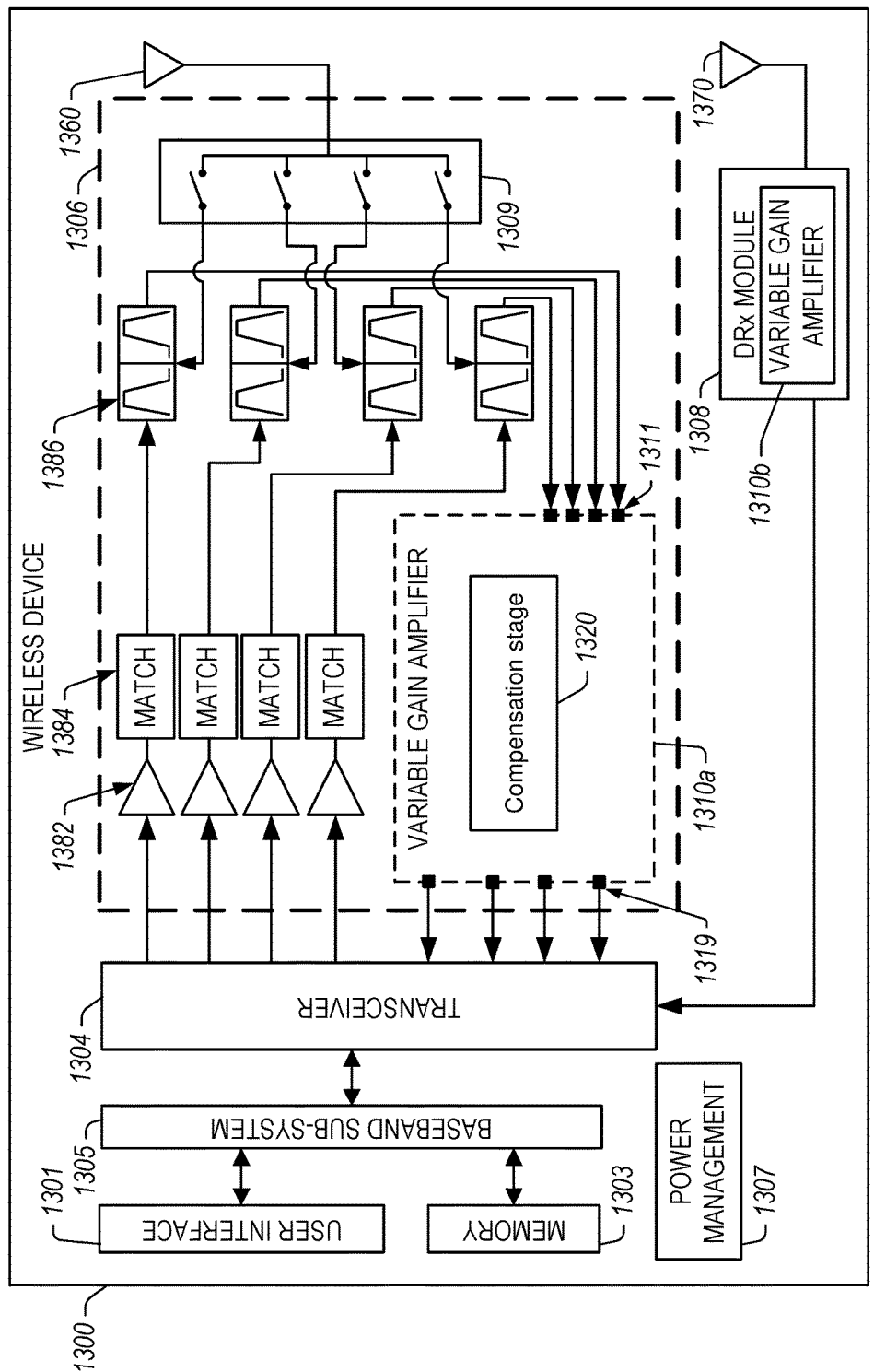
FIG. 14 depicts an example wireless device having one or more advantageous features described herein.

FIG. 14 depicts an example wireless device 1300 having one or more advantageous features described herein. In some embodiments, an LNA having one or more features as described herein can be implemented in each of one or more places in such a wireless device. For example, in some embodiments, such advantageous features can be implemented in a module such as a diversity receive (DRx) module 1308 having one or more low-noise amplifiers (LNAs).

FIG. 14 depicts an example wireless device 1300 having one or more advantageous features described herein. In the context of one or more modules having one or more features as described herein, such modules can be generally depicted by a dashed box 1306 (which can be implemented as, for example, a front-end module) and a diversity receiver (DRx) module 1308 (which can be implemented as, for example, a front-end module).

Referring to FIG. 14, power amplifiers (PAs) 1382 can receive their respective RF signals from a transceiver 1304 that can be configured and operated to generate RF signals to be amplified and transmitted, and to process received signals. The transceiver 1304 is shown to interact with a baseband sub-system 1305 that is configured to provide conversion between data and/or voice signals suitable for a user and RF signals suitable for the transceiver 1304. The transceiver 1304 can also be in communication with a power management component 1307 that is configured to manage power for the operation of the wireless device 1300. Such power management can also control operations of the baseband sub-system 1305 and the modules 1306 and 1308.

The baseband sub-system 1305 is shown to be connected to a user interface 1301 to facilitate various input and output of voice and/or data provided to and received from the user. The baseband sub-system 1305 can also be connected to a memory 1303 that is configured to store data and/or instructions to facilitate the operation of the wireless device, and/or to provide storage of information for the user.

In the example wireless device 1300, outputs of the PAs 1382 are shown to be matched (via respective match circuits 1384) and routed to their respective duplexers 1386. Such amplified and filtered signals can be routed to a primary antenna 1360 through a switching network 1309 for transmission. In some embodiments, the duplexers 1386 can allow transmit and receive operations to be performed simultaneously using a common antenna (e.g., primary antenna 1360). In FIG. 14, received signals are shown to be routed to a variable gain amplifier assembly 1310a, which provides the features and benefits of the variable gain amplifiers described herein. The DRx module 1308 includes a similar variable gain amplifier assembly 1310b as well.

In the example wireless device 1300, signals received at the primary antenna 1360 can be sent to a variable gain amplifier 1310a in the front end module 1306. The variable gain amplifier 1310a can include a compensation stage 1320. The variable gain amplifier 1310a is configured to receive a plurality of signals at inputs 1311 and output a plurality of processed signals at outputs 1319. The variable gain amplifier 1310a is configured to amplify signals based at least in part on a gain mode and to provide adjustments to input impedance with the compensation stage 1320 based at least in part on the gain mode. This can be done to reduce or eliminate power loss by fixing LNA input impedance to transfer maximum power over gain modes. The compensation stage 1320 can be configured to improve receive NF performance by reducing or minimizing impedance mismatches from the previous signal processing stage. The compensation stage circuit 1320 can be configured to maintain pre-LNA filter performance by reducing or eliminating impedance mismatch with the LNA circuit.

The wireless device also includes a diversity antenna 1370 and a diversity receiver module 1308 that receives signals from the diversity antenna 1370. The diversity receive module 1308 includes a variable gain amplifier 1310b, similar to the variable gain amplifier 1310a in the front end module 1306. The diversity receiver module 1308 and the variable gain amplifier 1310b process the received signals and transmit the processed signals to the transceiver 1304. In some embodiments, a diplexer, triplexer, or other multiplexer or filter assembly can be included between the diversity antenna 1370 and the diversity receiver module 1370, as described herein.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

One or more features of the present disclosure can be implemented with various cellular frequency bands as described herein. Examples of such bands are listed in Table 1. It will be understood that at least some of the bands can be divided into sub-bands. It will also be understood that one or more features of the present disclosure can be implemented with frequency ranges that do not have designations such as the examples of Table 1. It is to be understood that the term radio frequency (RF) and radio frequency signals refers to signals that include at least the frequencies listed in Table 1.

TABLE 1

| Band | Mode | Tx Frequency Range (MHz) | Rx Frequency Range (MHz) |
|---|---|---|---|
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B32 | FDD | N/A | 1,452-1,496 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

TABLE 1-continued

| Band | Mode | Tx Frequency Range (MHz) | Rx Frequency Range (MHz) |
|---|---|---|---|
| B45 | TDD | 1,447-1,467 | 1,447-1,467 |
| B46 | TDD | 5,150-5,925 | 5,150-5,925 |
| B65 | FDD | 1,920-2,010 | 2,110-2,200 |
| B66 | FDD | 1,710-1,780 | 2,110-2,200 |
| B67 | FDD | N/A | 738-758 |
| B68 | FDD | 698-728 | 753-783 |

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A signal amplifier having an input impedance that varies over different bias currents, the signal amplifier comprising:
   a plurality of input ports; and
   a compensation stage including a plurality of branches corresponding to the plurality of input ports with each branch including a switchable variable resistance configured to provide a targeted adjustment to the input impedance, the plurality of branches coupled to a single output port, the targeted adjustment selected to provide an approximately constant impedance at each of the plurality of input nodes.

2. The amplifier of claim 1 wherein the switchable variable resistance includes a switching transistor and a variable resistor.

3. The amplifier of claim 1 wherein the signal amplifier includes a shunt switch coupled to a reference node for each of the plurality of branches.

4. The amplifier of claim 1 wherein the targeted adjustment to the input impedance results in a total input impedance of the signal amplifier that is about 50 Ω.

5. The amplifier of claim 1 wherein in a first gain mode the switchable variable resistance provides a first resistance value and in a second gain mode lower than the first gain mode the switchable variable resistance provides a second resistance value greater than the first resistance value.

6. A radio-frequency (RF) amplifier, comprising:
   a plurality of input nodes;
   an output node;
   a gain stage configured to provide a plurality of gain levels that result in different input impedance values; and
   a compensation stage having an output coupled to an input of the gain stage, the compensation stage including a plurality of band selection switches coupled to the plurality of input nodes and a plurality of switchable variable resistance branches coupled to the band selection switches, individual switchable variable resistance branches configured to provide a targeted adjustment to a respective input impedance at each of a plurality of gain settings, the targeted adjustment selected to provide an approximately constant impedance at each of the plurality of input nodes.

7. The RF amplifier of claim 6 wherein the RF amplifier is a low-noise amplifier (LNA).

8. The RF amplifier of claim 7 wherein the LNA is implemented in a cascode configuration having an input stage and a cascode stage.

9. The RF amplifier of claim 6 wherein each of the plurality of band selection switches is configured to selectively couple a corresponding input node to a reference potential node.

10. The RF amplifier of claim 6 wherein each of the switchable variable resistance branches is configured to selectively provide a bypass path in at least one gain mode and a resistance path in at least one other gain mode.

11. The RF amplifier of claim 10 wherein the resistance path includes at least one variable resistive element that provides a targeted resistance value as a function of the plurality of gain levels.

12. A semiconductor die having a signal circuit, the semiconductor die comprising:
   a substrate; and
   a signal amplifier implemented on the substrate, the signal amplifier having an input impedance that varies over different bias currents, the signal amplifier comprising a plurality of input nodes, a single output node, and a compensation stage including a switchable variable resistance configured to provide a targeted adjustment to the input impedance at each of a plurality of gain settings, the targeted adjustment selected to provide an approximately constant impedance at each of the plurality of input nodes.

13. The semiconductor die of claim 12 wherein the substrate includes a silicon-on-insulator (SOI) substrate.

14. The semiconductor die of claim 12 wherein the signal amplifier is a low-noise amplifier (LNA).

15. The amplifier of claim 1 wherein each of the branches with a switchable variable resistance is configured to selectively provide a bypass path in at least one gain mode and a resistance path in at least one other gain mode.

16. The amplifier of claim 1 wherein the compensation stage further includes a plurality of band selection switches coupled to the plurality of input nodes such that each of the plurality of band selection switches is configured to selectively couple a corresponding input node to a reference potential node.

17. The semiconductor die of claim 12 wherein the compensation stage further includes a plurality of branches corresponding to the plurality of input ports with each branch including a switchable variable resistance configured to provide the targeted adjustment to the input impedance.

18. The semiconductor die of claim 17 wherein each of the branches with the switchable variable resistance is configured to selectively provide a bypass path in at least one gain mode and a resistance path in at least one other gain mode.

19. The RF amplifier of claim 6 wherein individual switchable variable resistance branches include a switching transistor and a variable resistor.

* * * * *